United States Patent
Peetz

(10) Patent No.: US 9,252,995 B2
(45) Date of Patent: Feb. 2, 2016

(54) TRANSMISSION OF PULSE LENGTH MODULATION INFORMATION

(75) Inventor: Roland Peetz, Nuremberg (DE)

(73) Assignee: Telefonaktiebolaget L M Ericsson (Publ), Stockholm (SE)

(*) Notice: Subject to any disclaimer, the term of this patent is extended or adjusted under 35 U.S.C. 154(b) by 0 days.

(21) Appl. No.: 14/423,853

(22) PCT Filed: Aug. 27, 2012

(86) PCT No.: PCT/EP2012/066620
§ 371 (c)(1),
(2), (4) Date: Feb. 25, 2015

(87) PCT Pub. No.: WO2014/032693
PCT Pub. Date: Mar. 6, 2014

(65) Prior Publication Data
US 2015/0326414 A1    Nov. 12, 2015

(51) Int. Cl.
*H03K 7/04* (2006.01)
*H03K 7/08* (2006.01)
*H04L 25/49* (2006.01)

(52) U.S. Cl.
CPC ............. *H04L 25/4902* (2013.01); *H03K 7/04* (2013.01); *H03K 7/08* (2013.01)

(58) Field of Classification Search
CPC ............. H04L 25/4902; H03F 3/217; H03F 2200/351; H03K 5/13; H03K 5/131; H03K 7/04; H03K 7/08
USPC ............................. 375/237, 238, 239; 332/109
See application file for complete search history.

(56) References Cited

U.S. PATENT DOCUMENTS

| | | | |
|---|---|---|---|
| 2005/0057319 A1* | 3/2005 | Maunuksela | H03K 5/133 332/106 |
| 2006/0238231 A1* | 10/2006 | Mutaguchi | H03K 7/08 327/291 |
| 2009/0154544 A1* | 6/2009 | Potscher | H03F 3/217 375/328 |
| 2010/0085097 A1* | 4/2010 | Bryant | H03F 1/0205 327/175 |
| 2010/0278228 A1* | 11/2010 | Vromans | H03F 3/24 375/238 |

FOREIGN PATENT DOCUMENTS

WO    2009122333 A2    10/2009

OTHER PUBLICATIONS

Bassoo, V., et al., "Distortion Arising from Polar to PWM/PPM Conversion in an All Digital Upconverter from Switching RF Power Amplifier", IEE MTT-S International Microwave Symposium Digest, Jun. 7, 2009, pp. 1533-1536, IEEE.

(Continued)

*Primary Examiner* — David B. Lugo
(74) *Attorney, Agent, or Firm* — Patent Portfolio Builders, PLLC

(57) ABSTRACT

The invention refers to switching a physical quantity, wherein the switching is performed by a switching element (SW) according to a control signal received from a control circuit (11), comprising detecting from the control signal (CS) a first number indicative of a time length, and a second number indicative of a point in time, generating a switching signal (S) comprising a switching pulse having a pulse length according to the time length and a pulse position according to the point in time, and providing the switching signal to the switching element (SW). The invention further refers to a power amplifier and to a corresponding computer program.

14 Claims, 3 Drawing Sheets

(56) References Cited

OTHER PUBLICATIONS

Heinrich, W., et al., "Advanced Switch-Mode Concepts using GaN: The Class-S Amplifier", 18th International Conference on Microwave Radar and Wireless Communications, Jun. 14, 2010, pp. 1-6, IEEE, Piscataway, NJ, US.

Fischer, G., et al., "Practical Design and Implementation Challenges of the Class-S PA", IEEE IMS WSC Advances in PA and TX Architectures, Jun. 7, 2009, pp. 1-36, IEEE.

Walk, J., et al., "Class-TS: Integrierter CMOS PA für Ternäre Modulation auf Basis Class-S CSCD", (Class-TS: Integrated CMOS PA for ternary modulation based on class S CSCD), Jun. 24, 2011, pp. 1-17, Friedrich-Alexander-University Erlangen-Nürnberg (FAU), DE.

* cited by examiner

```
Amplitude level/
Pulse length

0:  "0000001000"
1:  "0000011000"
2:  "0000111000"
3:  "0001111000"
4:  "0001111100"
5:  "0011111100"
6:  "0011111110"
7:  "0111111110"
8:  "0111111111"
9:  "1111111111"
```

TRANSMISSION OF PULSE LENGTH MODULATION INFORMATION

TECHNICAL FIELD

The present invention relates to pulse length modulation, and more specifically to operating a switching circuit, e.g. a switched power amplifier, by means of pulse length modulation.

BACKGROUND

Pulse width or pulse length modulation (PLM), is a commonly used technique for controlling power to electrical devices. The average value of a voltage (or current) fed to a load is controlled by turning the switch between supply and load on and off at a fast pace. The longer the switch is on compared to the off periods, the higher is the power supplied to the load.

An increasing need to improve an efficiency of power amplification regarding power consumption has brought the concept of pulse length modulation (PLM) into focus using e.g. so-called switched mode Class-S power amplifiers (PA), especially in the field of mobile communication. In this approach, power transistors inside the PA are driven by rectangular pulses at the carrier frequency. The on and off times are controlled by a digital signal, wherein a certain duration of an off time might be represented by a certain number of consecutive "0" (or "low") bits, and a certain duration of an on-time might be represented by a certain number of consecutive "1" (or "high") bits, or vice versa.

The rectangular pulses e.g. driving a transistor of the power amplifier switches might be generated by means of a shift register containing the consecutive number of "1" bits where the number of these bits relates to a pulse length (or an amplitude), and their position within the register is related to a delay or phase within the carrier period.

Due to an increasing requirement with respect to the switching rate, e.g. currently about 10 GHz, transferring the switching information (PLM sequences) from the processing or controlling circuit to the power amplifier circuit requires a high demand with respect to transmission resources. E.g. for transmitting a ternary switching signal from a mobile terminal base band (BB) circuit (ASIC or the FPGA) to a switched power amplifier circuit at a data transfer rate of 2×10 Gbit/s, two high-speed (gigabit) digital data lines are required, resulting in high requirements to the transmitter, to the receiver logic and to the board layout e.g. with respect to noise suppression. Alternatively, a number of parallel signal lines at corresponding lower data rates could be applied instead, but such parallel transmission would require augmented resources e.g. with respect to space (due to a corresponding number of pins in both circuits and wires on the printed circuit board).

SUMMARY

It is an object of the present invention to improve a transfer of the switching information between a controlling circuit, e.g. the mobile terminal baseband circuit, and a switching circuit, e.g. the mobile terminal switched power amplifier.

This object is achieved by the independent claims. Advantageous embodiments are described in the dependent claims.

In an embodiment, a coded information, also being referred to as coded vector, is generated in a controlling circuit (e.g. a mobile terminal baseband ASIC or FPGA) comprising information to switch-on and switch-off a switching element, wherein the information comprises an information element indicative of a switching pulse length, and an information element indicative of a switching pulse position. These elements are detected/decoded in a controlled circuit or switching circuit (e.g. a switched power amplifier) in order to perform a corresponding switching.

In an embodiment, the first information element corresponds to a first number of equal time fractions (bit time) resulting in the pulse length, and the second information element corresponds to a second number of the equal time fractions resulting in the time position within a certain time frame (also being referred to as time shift or phase shift).

Thus, instead of transmitting PLM sequences between the controlling circuit and the switching circuit, the above-described information elements are transmitted, wherein the switching circuit generates the corresponding PLM sequences based on these elements. This approach allows for significantly reducing an amount of information or data to be transmitted between controlling circuit and the controlled circuit. This allows for reducing the data speed between both circuits.

In an embodiment, the first number is an index or an address of a memory (look-up table) having stored a plurality of pulse sequences of different pulse lengths each of them being selectable by means of one of the index values. Each of the pulse sequences might comprise one or a plurality of pulses, each being represented by one or a plurality of consecutive bits of a first value (e.g. a "high" bit of value "1").

In an embodiment, from the received control signal, a bit sequence is generated comprising a plurality of bits of a second bit value, e.g. a low value ("0"), according to the second number, followed by one bit or a plurality of consecutive bits of the first value ("1"), according to the first number. This bit sequence, in the following also being referred to as PLM or pulse sequence, is fed to a signal driver that generates the switching pulse according to the bit sequence.

In an embodiment, the second number corresponds to a shift value being used to circularly shift the pulse sequence selected from the table (or a pulse sequence derived from the selected pulse sequence, e.g. by padding a certain number of "0" bits to the stored sequences, e.g. a number equal to the number of bits of the stored sequences) according to the second number. The shifting might be performed by means of a so-called barrel shifter that can be regarded as a digital circuit to circularly shift a data word by the specified number of bits.

In order to eliminate problems caused by a usage of binary modulated signals (arising from an offset due to the fact that always one transistor is in 'on'-state, thus resulting in a permanent power loss) a ternary modulated signal (e.g. valid values "00": both transistors off, "01": first transistor on and "10": second transistor on) can be used to switch the power amplifier. Such ternary signal is offset-free and reduces the overall 'on'-time of the transistors, as e.g. described in the article "Practical Design and Implementation Challenges of the Class-S PA" of Georg Fischer and Anrezej Samulak, IEEE IMS WSC Advances in PA and TX Architectures, June 2009. For realizing such switching, two separate signal lines (S+ and S−) might be provided for driving the power amplifier, wherein each signal corresponds to one switching transistor of the power amplifier circuit.

The pulses driving the complementary transistors of the power amplifier switches might be generated by a switch signal generator comprising two shift registers each being fed with sequences being shifted to each other about 180 degree.

Due to the currently demanded high switching rate at e.g. 10 GHz, the switching signal generator (i.e. the transformation function to generate the PLM signals from the above-described information elements) is preferably integrated in the power amplifier circuit (PA-IC) in order to reduce or avoid switching errors caused by signal distortions.

The present invention also concerns computer programs comprising portions of software codes in order to implement the method as described above when operated by a respective processing unit e.g. of a mobile terminal. The computer program can be stored on a computer readable medium. The computer-readable medium can be a permanent or rewritable memory e.g. within the mobile terminal or located externally. The respective computer program can be also transferred e.g. to the mobile terminal for example via a cable or a wireless link as a sequence of signals.

In the following, detailed embodiments of the present invention shall be described in order to give the skilled person a full and complete understanding. However, these embodiments are illustrative and not intended to be limiting.

DETAILED DESCRIPTION

Figure 1:
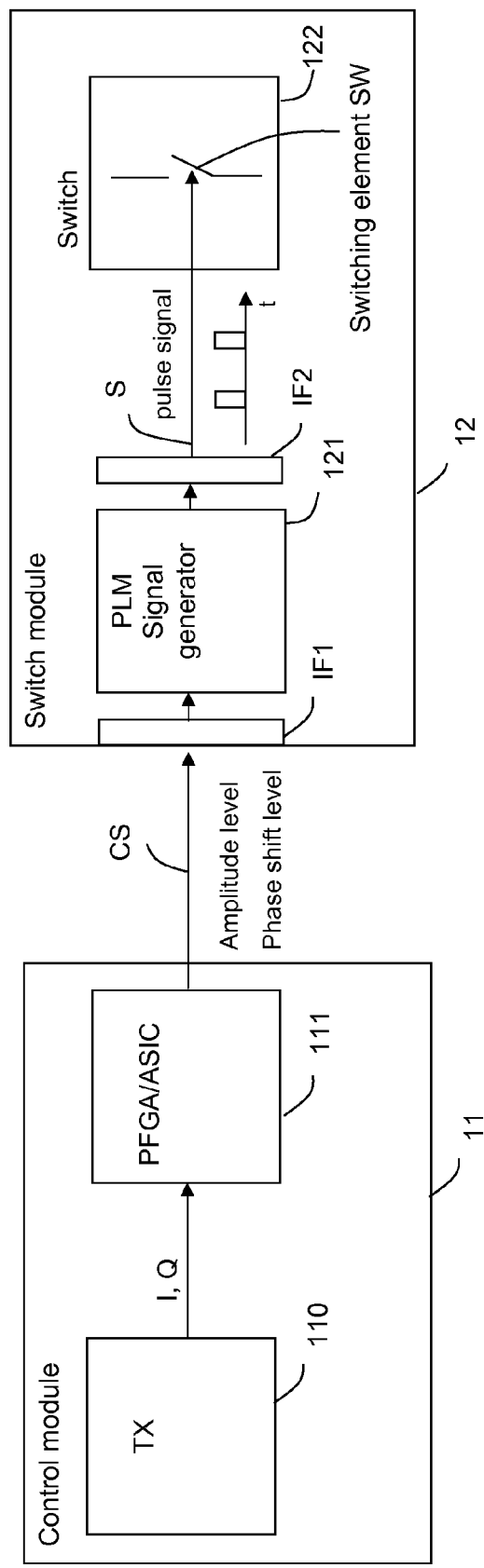
FIG. 1 shows an exemplary simple block diagram of a switching system according to a first embodiment.

FIG. 1 shows a principle block diagram of a switching system comprising a control module 11 that might be part of a digital baseband circuit and a switch module 12 of a mobile terminal or user equipment. The control module by way of example comprises a transmitter circuit 110 that forwards modulation information (e.g. in-phase component I and quadrature component Q) to a mapping circuit 111 (e.g. an FPGA, Field Programmable Gate Array, or an ASIC, Application-Specific Integrated Circuit). The mapping circuit 111 generates a control signal CS comprising switching parameters (amplitude and phase shift information) to be forwarded to the switch module 12.

The switch module 12 comprises a switching signal generator 121 and a switch 122. The switching (PLM) signal generator 121 receives the control signal CS over a first interface or connection IF1 and generates a switching signal S from the switching parameters received from the mapping circuit 111 to be provided to the switch 122 over a second interface or connection IF2. The switching parameters are indicative of switching (pulse) length and a relative switching (pulse) time shift (e.g. relative to a start time within a periodic time pattern). The switching signal S comprises one or a plurality of (ideally) rectangular pulses for driving a switching element SW of the switch 122. The switch 122 can be any device for switching a physical entity between two switching states ("on" and "off" state), e.g. a current, a voltage or power as being described in more detail in FIG. 2. The switching element might be e.g. a mechanical relay, a power transistor or a more complex electronic power circuit.

The switching signal generator 121 might comprise a shift register to be loaded with a bit sequence of a certain length, wherein a first number of "high" bits represent the length of the switch pulse and a second number of "low" bits preceding the high bits represent a phase shift with respect to a time point. E g. a sequence "000011110000" might represent a pulse having a duration of one third of a time period (four high bits out of 12 bits) and a time shift of 120 degree ($2/3\pi$) with respect to the starting time of the respective time period. The switching signal generator further comprises a signal modulator for generating the physical switching signal S (e.g. an electrical digital signal having two voltage levels) from the bit sequences adapted to drive the switching element SW.

It is to be noted that the time might be divided into a plurality of equal time frames, wherein for each time frame, one pulse of a certain length and position might be generated as described above. Consequently, the signal generator 121 might continuously receive actual pairs of information elements (switching parameters) at a data rate corresponding to the duration of the time frame (wherein each time frame is divided into a number of time fractions according to the number of bits of the sequences fed to the signal generator). The signal generator 121 the generates for each actual pair a corresponding PLM sequence S to be fed to the switch 122.

In order to eliminate problems caused by a usage of binary modulated signals arising from an offset due to the fact that always one transistor is in 'on'-state (thus resulting in a permanent power loss), above mentioned Class-S power amplifiers are proposed, driven by a ternary modulated signal to switch two power transistors of a pair of power transistors. Such amplifiers are offset-free and allow a reduction of the 'on'-times of the transistors. In order to transmit the ternary information, two switching signals (S1 and S2) are provided for driving the power amplifier, wherein each signal corresponds to one switching transistor of the power amplifier circuit.

Figure 2:
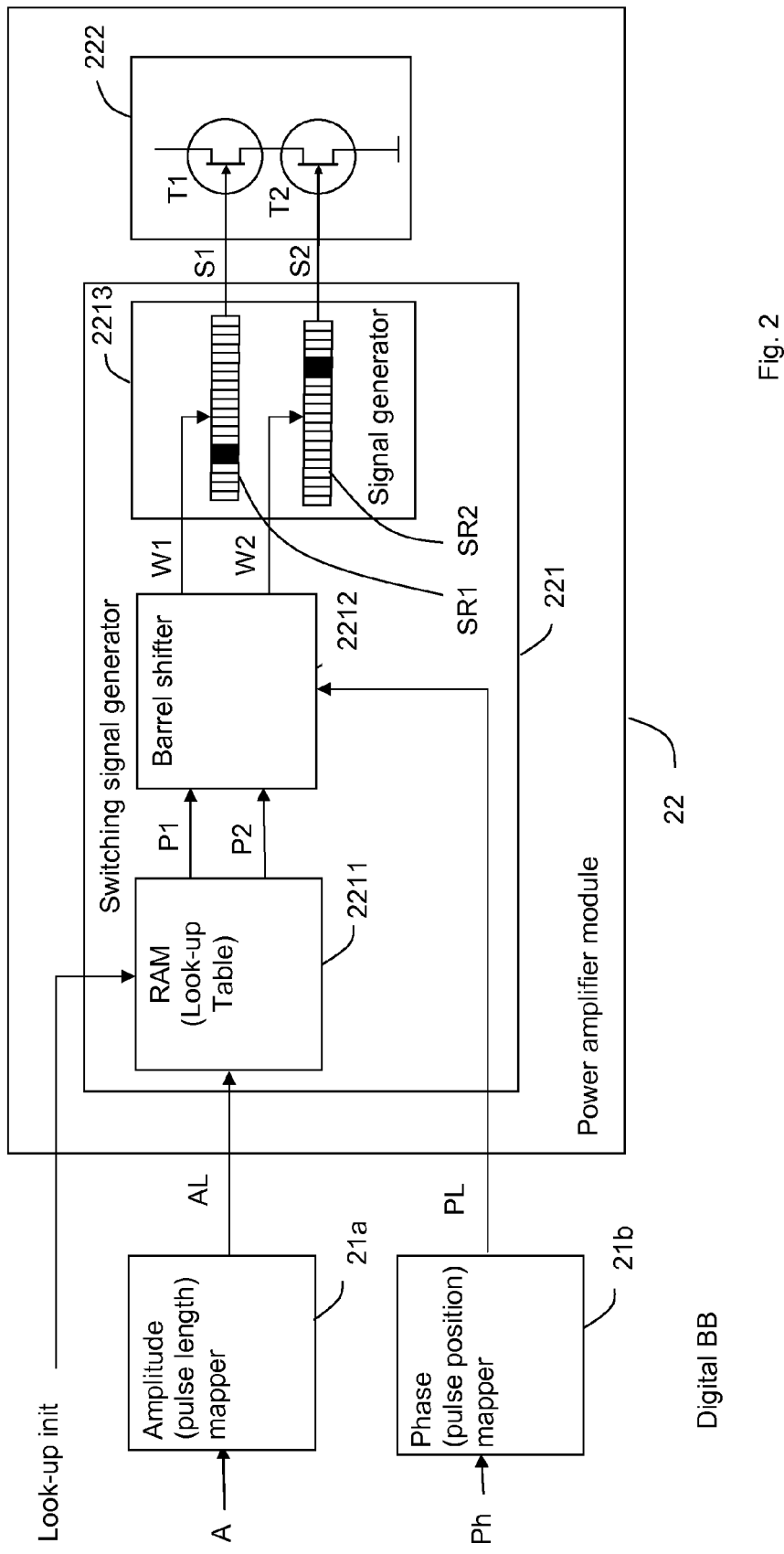
FIG. 2 shows an exemplary more detailed block diagram of a switching system according to a second embodiment.

Thereto, in the following FIG. 2, an embodiment involving a ternary pulse driven power amplifier is schematically depicted. FIG. 2 on the left side shows exemplary functional blocks of a mobile terminal baseband circuit (Digital BB) comprising a first mapping circuit 21a for generating from an amplitude information A a first part control signal AL comprising an amplitude level or pulse length information, and a second mapping circuit 21b for generating from an phase information Ph a second part control signal PL comprising a phase shift level or pulse position information (the amplitude A and the phase Ph are equivalent to above-mentioned I and Q value, thus A and Ph might be directly derived from I and Q).

On the right side, a power amplifier module 22 is shown comprising a (ternary switch) signal generator 221 and a power amplifier 222. The signal generator 221 by way of example comprises a pulse sequence generator 2211, a barrel shifter 2212, and a control signal generator 2213. The control signal generator 2213 comprises a first shift register SR1 and a second shift register SR2.

The power amplifier by way of example comprises a first switching transistor T1 and a second switching transistor T2.

The pulse sequence generator 2211 by way of example comprises a look-up table that has stored a plurality of digital sequences of a certain length (L/2 being half of the length L of a sequence provided to the control signal generator 2213). Each of these sequences comprises an individual number of consecutive "1" values, by way of example being arranged centered or almost centered as shown in FIG. 3, being described below in more details.

Accordingly, the amplitude mapping circuit 21a maps the value range of the amplitude signal determined by the bit width of the amplitude signal to the value range of the number of consecutive "1" values for the pulse length modulated signal, with a maximum length of L/2.

The phase mapping circuit 21b maps the value range of the phase signal determined by its bit to the value range of the possible position for the pulse length modulated signal. As the pulse position might vary over the whole sequence length L, the phase shift level might be a value in the range between 0 an L−1 (thus the phase shift level value is a selected value out of L possible values).

Figures 3, 4:
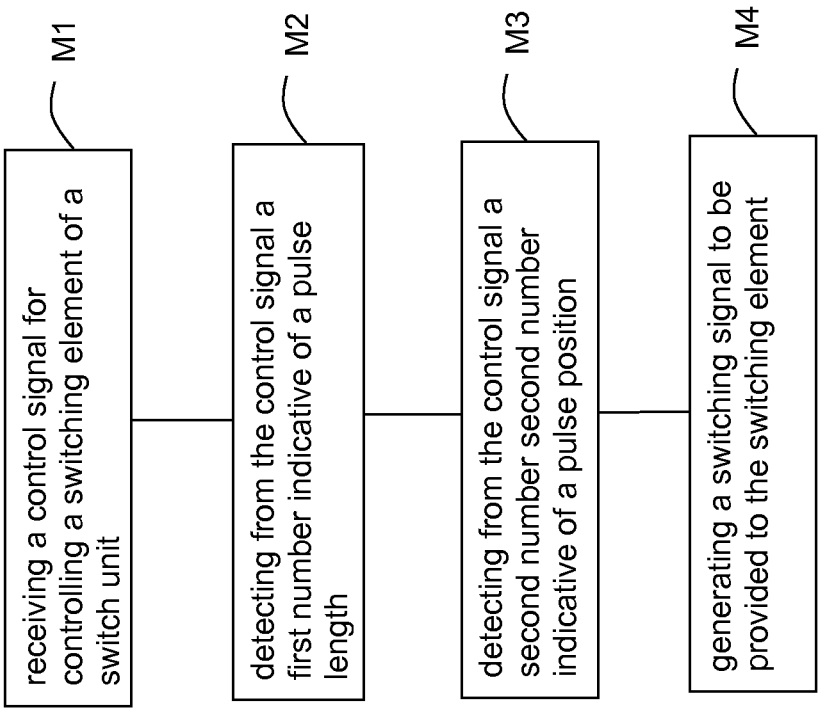
FIG. 3 shows a data association associated to a power amplifier control circuit of FIG. 2.
FIG. 4 shows an exemplary sequence of steps to be performed according to the first embodiment.

An exemplary look-up table for L=20 is shown in FIG. 3. As described above, for ternary switched power amplifiers, only pulses have a maximum length of L/2 are allowed; thus according to the example, only 10 different lengths must be addressed. The 10 different pulse length sequences are exemplarily addressed (selected) by an address value in the range between "0" and "9".

The values of both switching signals (S1 and S2) to be provided to the power transistors T1 and T2 are related to each other in a way that the second switching signal S2 equals to the first switching signal S1 shifted by a phase value of 180 degrees within one carrier period. Thus, the pulse sequence generator 2211 can generate the pulse length sequence P1 by taking an addressed pulse length value (of length L/2) from the look-up table and appending further L/2 "0" values, in order to generate a sequence of length L (e.g. 00001100000000000000). Consequently the second pulse length sequence P2 can be generated by taking L/2 consecutive "0" values appended by the same pulse length value (e.g. 00000000000000110000).

In order to provide for a flexibility for pattern/pulse mapping when generating the pulse lengths for the transistor switching signals the look-up table might be stored in a RAM being loadable e.g. from the digital baseband circuit (by means of a look-up initialization message (Look-up init) prior to operation.

The barrel shifter 2212 generates shifted sequences W1 and W2 by (cyclically) shifting the pulse length signal according to the actual phase shift level value received from the phase mapping circuit 21b (e.g. a shift about 90 degree or 5 bits will arrive at the following values for W1 and W2 according to the above-shown exemplary sequences: W1: 00000001100000000000; W2: 00000000000000000110). Thus, the shifted sequences W1 and W2 both contain a certain number of consecutive "1"s where the number of "1"s (pulse length) is related to the amplitude, and the position of the number of consecutive "1" is related each to the phase within the carrier period.

The (rectangular) pulse signals S1 and S2 driving each one of the transistors T1 and T2 of the power amplifier switches might be generated by means of each a shift register SR1 and SR2. The shift registers SR1 and SR2 are loaded by each one of the shifted sequences W1 and W2 at a refresh rate or r/L, wherein r is the (maximum) switching rate of the power amplifier.

Due to the high switching rate of current power switches, e.g. 10 GHz or even more, the shift registers circuit 2213 is preferably integrated together with the power amplifier 222, e.g. together in a power amplifier module as illustrated in FIG. 2 in order to reduce or avoid switching errors caused by signal distortions.

In the following, a consideration of information to be exchanged between the digital baseband module and the power amplifier module 22 (i.e. amplitude level and phase shift level information) is presented:

When the length of the shift registers in number of bits is given by L then the necessary number of bits for the phase information is given by:

$$n=\lceil \log_2 L \rceil$$

As discussed above, the differential transistor operation requires always at least one transistor of the transistors T1 and T2 being turned off, thus resulting in a maximum number of "high" bits or "ones" equal L/2. Therefore the number of bits for the amplitude information is given by:

$$m=\lceil \log_2 L/2 \rceil n-1$$

The size of the look-up table evaluates to $m=\lceil \log_2 L/2 \rceil$ entries with a width of L.

In a following example, considerations for an exemplary register length of L=40 bits are made:

For an exemplary switching rate of 10 GHz, an update rate of the shift-registers of 10 GHz/40=250 MHz is required.

The amplitude/pulse length coding is such that all lengths from 1 bit to 20 bits can be controlled. In other words, 20 different lengths might be applied. According to the following equation:

$$n=\lceil \log_2 40 \rceil = 6$$

Thus the total number of bits to be transferred from the baseband circuit to the power amplifier is:

$$m+n=2n-1=11$$

This can be transferred by e.g. 11 LVDS signals without a need of a high speed transmission protocol overhead.

Above-described embodiments allows for significantly reducing the amount of data to be transferred from the controlling circuit (baseband IC) to the switching circuit (power amplifier IC).

Additionally, the lower transfer rate of the signals between the baseband circuit and the power amplifier circuit makes board design more simple as well as I/O buffer and transmitter/receiver design.

The higher the requirements with respect to a resolution of the amplitude/phase values, the more reduction of resources; increasing a resolution by a factor 2 only requires two further bits.

In the following an exemplary method will be shown with respect to FIG. 4:

In a first step M1, switch (PLM) signal generator 121 or 221 receives a control signal for controlling a switching element of a switch unit, in a second step M2, the signal generator detects from the control signal a first number indicative of a pulse length, in a third step M3, the signal generator detects from the control signal a second number indicative of a pulse position, and in a fourth step M4, the signal generator generates a switching signal S, S1, S2 to be provided to the switching element SW, T1 or T2.

The invention claimed is:

1. A method for switching of a physical quantity, wherein the switching is performed by a switching element according to a control signal received from a control circuit, the method comprising:

detecting, from the control signal, a first number indicative of a time length, and a second number indicative of a point in time;

generating a switching signal comprising a switching pulse having a pulse length according to the first number and a pulse position according to the second number;

providing the switching signal to the switching element.

wherein the generating the switching signal comprises:

generating a bit sequence based on the first number and the second number;

providing the bit sequence to a signal driver for transforming the bit sequence into the switching signal by:

obtaining a selected bit sequence by selecting one out of a plurality of stored sequences based on the first number;

circular shifting to the selected bit sequence, or a sequence derived from the selected bit sequence, based on the second number.

2. The method of claim 1, wherein, if second number is not zero, the bit sequence comprises one bit or a plurality of consecutive bits of a first value according to the first number, preceded by one bit or a plurality of consecutive bits of a second value according to the second number.

3. The method of claim 2, wherein the sequence derived from selected bit sequence is generated by adding a plurality of consecutive bits of the second value of the number of the stored sequences.

4. The method of claim 1:

wherein the stored sequences are stored as a table in an addressable memory;

wherein selecting the stored bit sequence comprises using the first number as an address of a memory section having stored the selected bit sequence.

5. The method of claim 4, wherein the table is re-programmable by means of an initialization message.

6. The method of claim 1, wherein the switching signal is generated by a signal driver comprising:

a barrel shifter unit that generates the circularly shifted bit sequence by shifting the selected bit sequence, or a sequence generated from the selected bit sequence, according to the second number;

a shift register unit coupled to the barrel shifter unit receiving the shifted bit sequence;

a signal driver coupled to the shift register unit and generating the switching signal from the content of shift register of the shift register unit.

7. The method of claim 1, further comprising:

generating a further switching signal from the first number and the second number;

providing the switching signal and the further switching signal to each one of two complementary transistors of a power amplifier.

8. The method of claim 7, wherein the further switching signal is generated from a further bit sequence that is circularly shifted with respect to the bit sequence for generating the switching signal about L positions, wherein L equals half of the number 2L of bits of the bit sequence.

9. The method of claim 8, wherein the further bit sequence comprises one bit or a plurality of consecutive bits of a first value based on the first number, preceded by one bit or a plurality of consecutive bits of a second value based on a sum of the second number and half the number 2L of bits of the bit sequence.

10. The method of claim 7:

wherein the switching signal and the further switching signal are generated by means of a signal generator comprising a first shift register and a second shift register;

wherein the first shift register is fed with the bit sequence and the second shift register is fed with the further bit sequence.

11. The method of claim 1:

wherein the control circuit is integrated in a baseband circuit of a mobile terminal;

wherein the switching signal generator is integrated into a power amplifier of the mobile terminal.

12. A switching signal generator for generating a switching signal for switching a physical quantity, by a switching element, according to a control signal received from a control circuit, the switching signal generator comprising:

a first interface configured to receive a control signal comprising an information of a first number indicative of a time length, and of a second number indicative of a point in time;

a processing circuit configured to generate a switching signal comprising a switching pulse having a pulse length according to the time length and a pulse position according to the point in time;

memory having a stored table of a plurality of sequences, the memory configured to select a bit sequence based on the first number;

a barrel shifter configured to cyclically shift the selected bit sequence, or a sequence derived from the selected sequence, based on the second number;

a second interface configured to provide the switching signal to the switching element.

13. The switching signal generator of claim 12, wherein the processing circuit is configured to generate a bit sequence comprising a plurality of consecutive bits of a first bit value based on the second number, followed by a plurality of consecutive bits of a second value based on the first number.

14. A computer program product stored in a non-transitory computer readable medium for controlling switching of a physical quantity by a switching element of a mobile terminal, the mobile terminal having a processing circuit comprising a switching signal generator, the computer program product comprising software instructions which, when run on the processing circuit, causes the switching signal generator to:

detect, from a control signal received from a control circuit, a first number indicative of a time length, and a second number indicative of a point in time;

generate a switching signal comprising a switching pulse having a pulse length according to the first number and a pulse position according to the second number;

wherein the generating the switching signal comprises:

generating a bit sequence based on the first number and the second number;

providing the bit sequence to a signal driver for transforming the bit sequence into the switching signal by:

obtaining a selected bit sequence by selecting one out of a plurality of stored sequences based on the first number;

circular shifting to the selected bit sequence, or a sequence derived from the selected bit sequence, based on the second number;

provide the switching signal to the switching element.

\* \* \* \* \*